United States Patent [19]
Hsu et al.

[11] Patent Number: 5,918,131
[45] Date of Patent: Jun. 29, 1999

[54] METHOD OF MANUFACTURING A SHALLOW TRENCH ISOLATION STRUCTURE

[75] Inventors: Shih-Ying Hsu, Hsinchu; Heng-Sheng Huang, Taipei, both of Taiwan

[73] Assignee: United Microelectronics Corp., Taiwan

[21] Appl. No.: 08/961,062

[22] Filed: Oct. 30, 1997

[30] Foreign Application Priority Data

Sep. 11, 1997 [TW] Taiwan ................................. 86113151

[51] Int. Cl.⁶ .......................... H01L 21/336; H01L 21/76
[52] U.S. Cl. ...................... 438/296; 438/424; 438/427; 438/435
[58] Field of Search .................... 438/296, 424, 438/427, 435, FOR 227

[56] References Cited

U.S. PATENT DOCUMENTS

| | | |
|---|---|---|
| 4,962,064 | 10/1990 | Haskell et al. . |
| 5,371,036 | 12/1994 | Lur et al. . |
| 5,696,021 | 12/1997 | Chan et al. . |
| 5,731,221 | 3/1998 | Kwon . |
| 5,753,561 | 5/1998 | Lee et al. . |

*Primary Examiner*—John F. Niebling
*Assistant Examiner*—Josetta I. Jones
*Attorney, Agent, or Firm*—Finnegan, Henderson, Farabow, Garrett & Dunner, L.L.P.

[57] ABSTRACT

A method of manufacturing a shallow trench isolation structure that utilizes the early formation of a strong oxide spacers so that for any subsequent pad oxide layer or sacrificial oxide layer removal using a wet etching method, the oxide layer adjacent to the substrate will not be over-etched to form recesses, thereby preventing the lowering of threshold voltage and the induction of a kink effect. The method includes the steps of forming a mask over a substrate and then patterning the mask to form a protective layer for subsequent etching operation. An oxide space is farmed on the sidewalls of the mask over the surface of the substrate. Subsequently, a trench is formed in the substrate along the side edges of the oxide spacers. A liner oxide box is formed on the sidewall of the trend and the liner oxide layer does not fill the trench. This is followed by filling the trench with a second oxide layer. After planarizing the upper surface with a chemical-mechanical polishing action, the mask is removed.

16 Claims, 3 Drawing Sheets

METHOD OF MANUFACTURING A SHALLOW TRENCH ISOLATION STRUCTURE

BACKGROUND OF THE INVENTION

1. Field of Invention

The present invention relates to a shallow trench isolation structure and method of manufacture. More particularly, the present invention relates to a method of manufacturing a shallow trench isolation structure having oxide spacers.

2. Description of Related Art

In the conventional fabrication of semiconductor devices, shallow trenches are normally formed between the devices, and then filled by an insulating material to form a field oxide layer for isolation purpose. FIGS. 1A and 1B are cross-sectional views showing the steps in the fabrication of a conventional shallow trench isolation structure. First, as shown in FIG. 1A, a pad oxide layer 10 and a silicon nitride layer 12 are sequentially formed over a semiconductor substrate 1. Then, using conventional photolithographic and etching techniques, a trench isolation structure is formed in the substrate 1. Subsequently, an oxide layer 14 is deposited over the silicon nitride layer 12 and the trench isolation structure. Next, a chemical-mechanical polishing method is used to planarize the structure and to remove unwanted oxide layer 14. Finally, the silicon nitride layer 12 and the pad oxide layer 10 is removed to form the device field oxide layer as shown in FIG. 1B.

In the aforementioned method, the pad oxide layer 10 is removed using a wet etching method that uses hydrofluoric acid as an etchant in the etching process. Using an isotropic etching solution such as hydrofluoric acid, the upper surfaces of the oxide layer 14 adjacent to the substrate 1 can be easily over-etched to form recesses 16 at the upper part of the trench sidewalls.

Furthermore, after the formation of the field oxide layer, a protective sacrificial oxide layer is normally formed over the substrate surface just before any N-well or P-well implantation. In subsequent processes, the sacrificial oxide layer is also similarly removed using hydrofluoric acid. Therefore, the surfaces of the field oxide layer neighboring the substrate may similarly be over-etched.

When the manufacturing processes for forming the semiconductor devices are complete, the recesses on the surface of the field oxide layer adjacent to the substrate surface due to over-etching will lead to an accumulation of electric charges. This can adversely affect the threshold voltage of the device and generates abnormal subthreshold current, which is also known as the kink effect. The lowering of the threshold voltage accompanied by an abnormal subthreshold current will lower the quality of the device, and will lead to a lower product yield. Thus, the outcome of this semiconductor manufacturing process is undesirable.

In light of the foregoing, there is a need in the art to improve the shallow trench isolation structure and its method of manufacture.

SUMMARY OF THE INVENTION

Accordingly, the present invention is directed to provide a method of manufacturing a shallow trench isolation structure. Through forming strong oxide spacers earlier on in the process, the field oxide layer adjacent to the substrate will not be over-etched to form recesses. Hence, threshold voltage will not be lowered and the kink effect reduced during subsequent removal of oxides in a wet etching process.

To achieve these and other advantages and in accordance with the purpose of the invention, as embodied and broadly described herein, the invention provides a method for manufacturing a shallow trench isolation structure. The method comprises the steps of sequentially forming a pad oxide layer, a silicon nitride layer and a masking oxide layer over a substrate, then patterning the silicon nitride layer, the pad oxide layer and the masking layer into specific regions as required. The pad oxide layer, the silicon nitride layer and the masking layer together form a protective masking for subsequent etching processes. Thereafter, a first oxide layer is formed over the substrate and the silicon nitride surface. Then, the first oxide layer is etched to form thick oxide spacers on the sidewalls of the silicon nitride layer. Subsequently, the substrate is etched along the side edges of the oxide spacers to form a trench. After that, a liner oxide layer is formed on the sides and bottom of the trench. This is followed by forming a second oxide layer over the above layers, and then etching back the second oxide layer. Finally, the silicon nitride layer and the pad oxide layer are removed to expose the oxide spacers of this invention.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
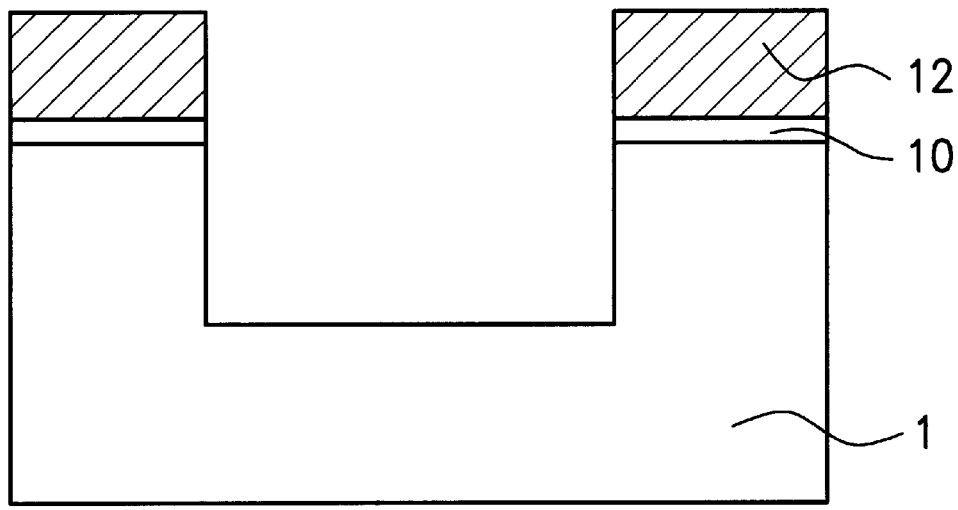
FIGS. 1A and 1B are cross-sectional views showing the steps in the fabrication of a conventional shallow trench isolation structure.
Figure 1B:
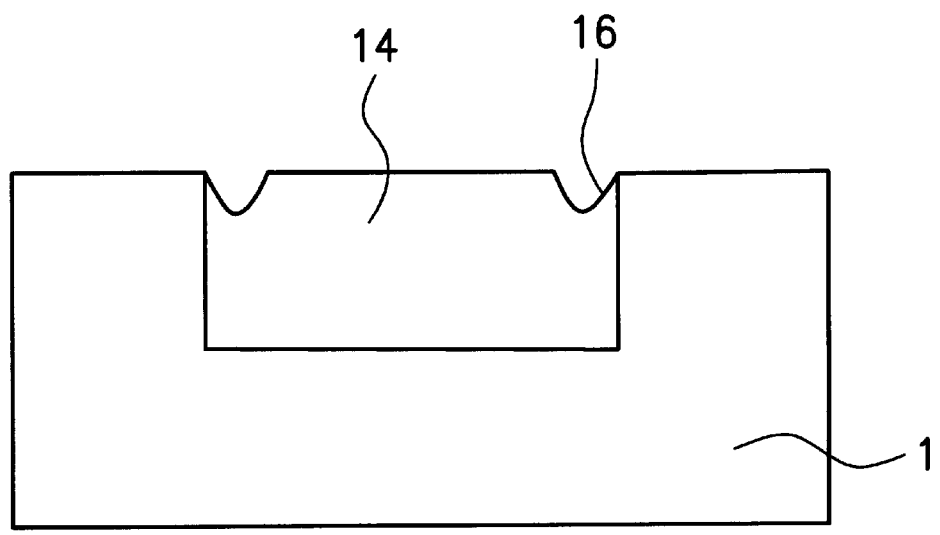

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are cross-sectional views showing the progression of steps in the production of a shallow trench isolation structure according to one preferred embodiment of this invention.

Figure 2A:
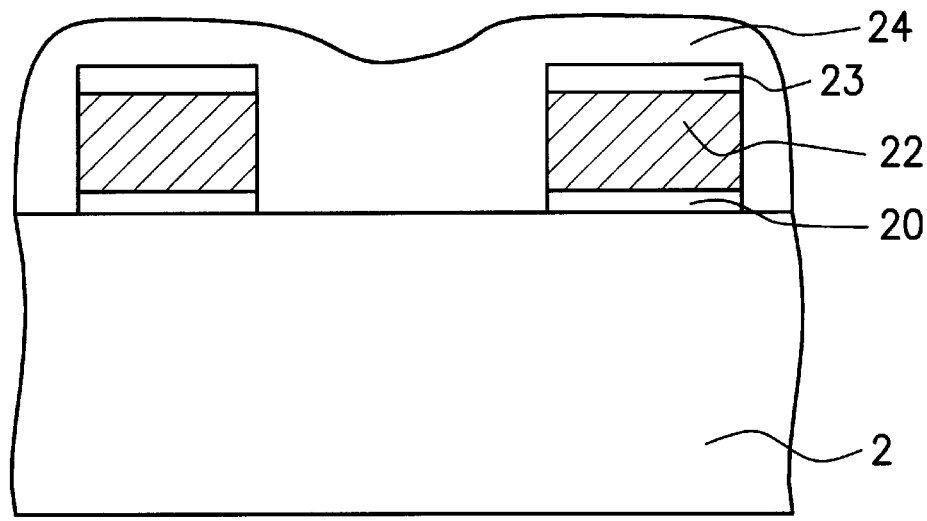
FIGS. 2A through 2E are cross-sectional views showing the progression of steps in the production of a shallow trench isolation structure according to one preferred embodiment of this invention.

First, as shown in FIG. 2A, a pad oxide layer 20 is formed above a substrate 2 by a thermal oxidation process. The pad oxide layer 20 can be, for example, a silicon dioxide layer ($SiO_2$) preferably having a thickness of about 90 Å to 300 Å. Then, a chemical vapor deposition (CVD) method is used to form a silicon nitride layer 22 over the pad oxide layer 20. The silicon nitride layer 22 is preferably deposited to a thickness of about 1000 Å to 3000 Å. Next, a chemical vapor deposition method is again used to deposit a masking oxide layer 23 over the silicon nitride layer 22 preferably having a thickness of about 1000 Å to 3000 Å. Thereafter, photolithographic and etching processes are used to form a pattern in the pad oxide layer 20, the silicon nitride layer 22 and the masking oxide layer 23. In other words, the pad oxide layer 20, the nitride layer 22 and the masking oxide layer 23 are selectively etched using the substrate as an etching stop layer. The pad oxide layer, the silicon nitride layer and the masking oxide layer together serve as a protective mask in subsequent processes. Subsequently, a first oxide layer 24 is deposited over the substrate 2, the pad oxide layer 20, the silicon nitride layer 22 and the masking oxide layer 23. For example, the first oxide layer 24 is preferably deposited to a thickness of about 500 Å to 2500 Å using a chemical vapor deposition method.

Figure 2B:
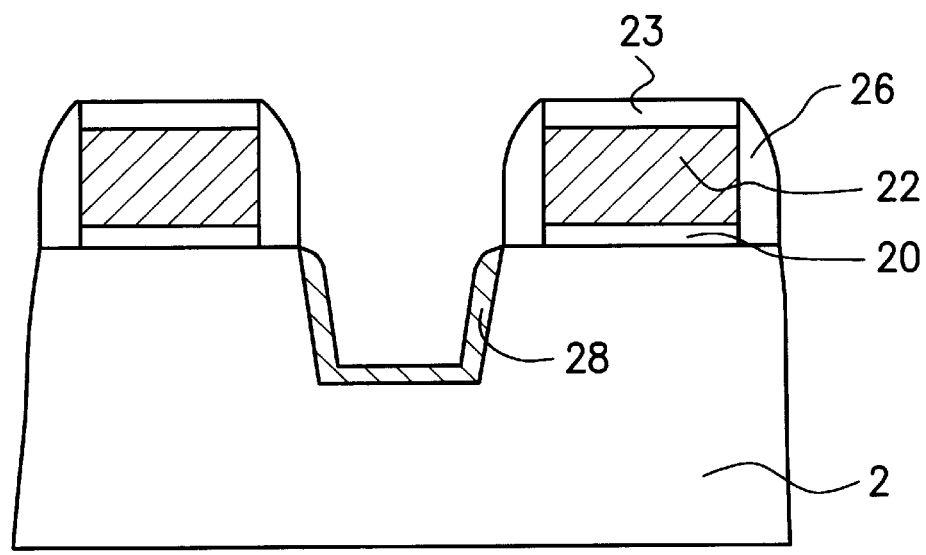

Next, as shown in FIG. 2B, the first oxide layer 24 is etched back to form oxide spacers 26 on the sidewalls of the protective mask over the surface of the substrate 2. A dry etching method can be used in the etching back process. Then, using an etching process again, the substrate 2 is etched downward along the side edges of the oxide spacers 26 to form a trench. The masking oxide layer 23 above the silicon nitride layer 22 serves as a mask during the etching operation. The etching is performed, for example, using a dry etching method, and the trench depth is preferably about 4000 Å. Thereafter, if situation demands, a liner oxide layer 28 can be formed preferably to a thickness of about 200 Å to 500 Å on the sides and bottom of the trench using a thermal oxidation process such that the layer 28 does not feel the trench.

Figure 2C:
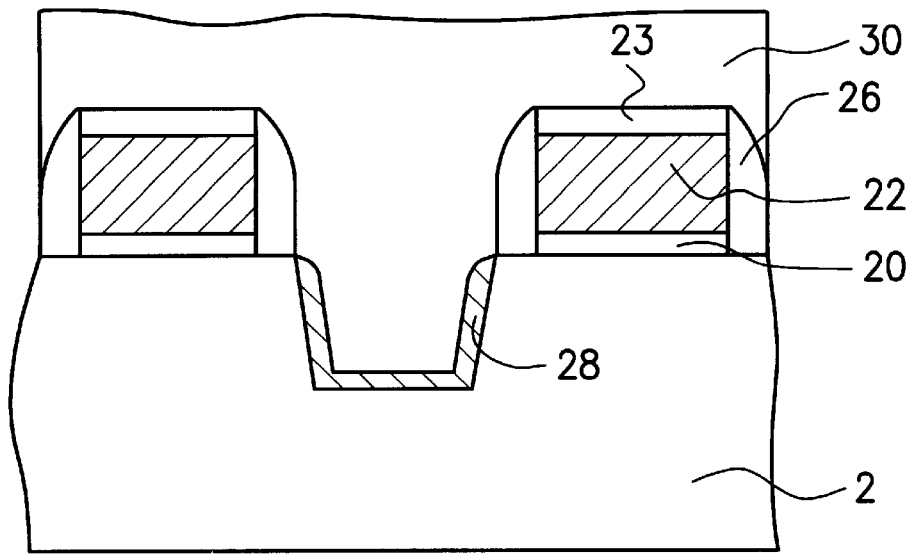

Next, as shown in FIG. 2C, a second oxide layer 30 is formed over the liner oxide layer 28 surface and the oxide spacers 26, filling up the trench and extending over the surface of the masking oxide layer 23. The second oxide layer 30 has a thickness preferably about 5000 Å to 8000 Å deposited using an atmospheric pressure chemical vapor deposition (APCVD) method. Thereafter, the second oxide layer 30 is densified at a high temperature, for example, using a temperature of about 1000° C. for about 10 to 30 minutes. The second oxide layer 30 becomes denser because it will contract upon heating. Another method of forming the second oxide layer 30 is to deposit the second oxide layer using a high-density plasma chemical vapor deposition (HDPCVD) method. Because a high density and quality oxide layer can be produced using the HDPCVD method, no extra high temperature densification operation is needed.

Figure 2D:
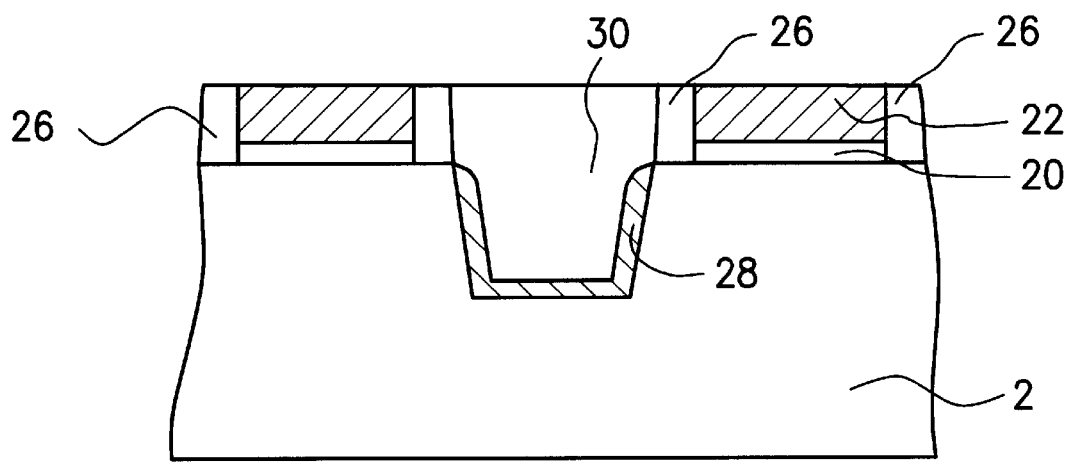

Next, as shown in FIG. 2D, the second oxide layer 30 is planarized, for example, using a chemical-mechanical polishing (CMP) method or a wet etching method. In the planarization process, the masking oxide layer 23 above the silicon nitride layer 22, portions of the oxide spacers 26 and portions of the second oxide layer 30 are removed. When a CMP method is used, a silicon nitride layer or similar hard material layer can serve as a polishing stop layer. Since the silicon nitride layer 22 is durable and has a thickness of about 1000 Å to 3000 Å, it is particularly suitable to be the polishing stop layer for a CMP operation.

Figure 2E:
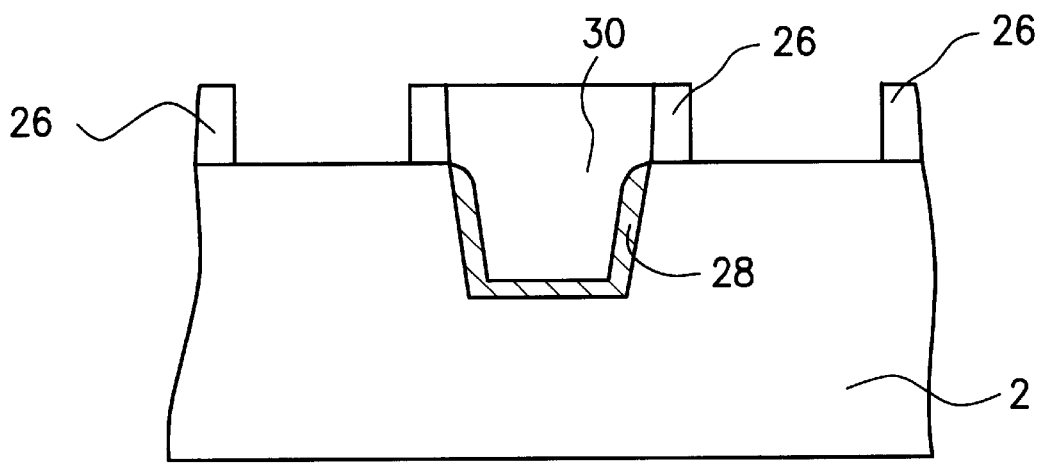

Next, as shown in FIG. 2E, the silicon nitride layer 22 is removed using a wet etching method or a plasma etching method. In a wet etching method, phosphoric acid solution heated to a temperature of between 150° C. to 180° C. is used, while in a plasma etching method, an assembly of gases including sulfur hexafluoride ($SF_6$), argon, and oxygen are used. Finally, the pad oxide layer 20 is removed by hydrofluoric acid in a wet etching method. Consequently, oxide spacers 26 are formed on a portion of the sidewalls of the oxide layer 30 that lies above the upper substrate surface according to this invention. The oxide spacers can protect the sidewalls of the trench against the formation of recesses. Moreover, should processes demand the formation of a sacrificial oxide layer using a thermal oxidation process, and subsequently needed to be removed, the oxide spacers in this invention can protect the sidewalls of the trench against powerful attack by the hydrofluoric acid in the wet etching process.

Because of the thick oxide spacers, the second oxide layer adjacent to the substrate will not be over-etched by hydrofluoric acid to form recesses during subsequent etching operation for the removal of pad oxide layer and sacrificial oxide layer. Therefore, a more reliable device structure is obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a shallow trench isolation structure, comprising the steps of:

forming a mask over a substrate, wherein the mask has an opening;

forming a first oxide layer on the surface of the mask;

etching back the first oxide layer to form an oxide spacer on a sidewall of the mask over the surface of the substrate, wherein the oxide spacer remains during and after removal of the mask;

forming a trench in the substrate along the side edges of the oxide spacers;

forming a liner oxide layer on a sidewall of the trench, wherein the liner oxide layer does not fill the trench;

depositing a second oxide layer to fill up the trench, wherein the step of depositing the second oxide layer includes using a high-density plasma chemical vapor deposition method, and the range of deposition extends into the masking oxide surface; and removing the mask, wherein the liner oxide layer and the oxide spacer are used to prevent the second oxide layer from forming recesses because of over-etching.

2. The method of claim 1, wherein the step of forming the mask includes the substeps of:

forming a pad oxide layer over the substrate surface;

forming a silicon nitride layer over the pad oxide layer surface;

forming a masking oxide layer over the silicon nitride layer surface; and etching the pad oxide layer, the silicon nitride layer and the masking oxide layer.

3. The method of claim 1, wherein the step of forming the pad oxide layer includes using a thermal oxidation process.

4. The method of claim 1, wherein the pad oxide layer has a thickness of about 90 Å to 300 Å.

5. The method of claim 2, wherein the silicon nitride layer has a thickness of about 1000 Å to 3000 Å.

6. The method of claim 2, wherein the masking layer oxide has a thickness of about 3000 Å to 1000 Å.

7. The method of claim 1, wherein the step of forming the first oxide layer includes depositing oxide to a thickness of about 500 Å to 2500 Å using a chemical vapor deposition method.

8. The method of claim 1, wherein the step of etching back the first oxide layer includes using a dry etching method.

9. The method of claim 1, wherein the step of forming the trench includes using a dry etching method.

10. The method of claim 13, wherein the step of forming a liner oxide layer uses a thermal oxidation process.

11. The method of claim 1, wherein the step of depositing a second oxide layer to fill the trench further includes the substeps of:

depositing a second oxide layer over the trench and the surface of the masking oxide layer;

etching back the second oxide layer; and etching back the masking oxide layer and portions of the oxide spacers.

12. The method of claim 11, wherein the second oxide layer has a thickness of about 6000 Å.

13. A method for forming a shallow trench isolation structure, comprising the steps of:

forming a mask over a substrate, wherein the mask has an opening;

forming a first oxide layer on the surface of the mask;

etching back the first oxide layer to form an oxide spacer on a sidewall of the mask over the surface of the substrate, wherein the oxide spacer remains during and after removal of the mask;

forming a trench in the substrate along the side edges of the oxide spacers;

forming a liner oxide layer on a sidewall of the trench, wherein the liner oxide layer does not fill the trench;

depositing a second oxide layer to fill the trench; and etching back the second oxide layer and removing the mask using a chemical-mechanical polishing method, wherein the liner oxide layer and the oxide spacer are used to prevent the second oxide layer from forming recesses because of over-etching.

14. A method for forming a shallow trench isolation structure comprising the steps of:

forming a silicon nitride layer on a substrate;

forming a mask on the silicon nitride layer wherein the mask and the silicon nitride layer have an opening;

forming a first oxide layer on the surface of the mask;

etching back the first oxide layer to form an oxide spacer on a sidewall of the mask over the surface of the substrate, wherein the oxide spacer remains during and after removal of the mask;

forming a trench in the substrate along the side edges of the oxide spacers;

forming a liner oxide layer on a sidewall of the trench, wherein the liner oxide layer does not fill the trench;

depositing a second oxide layer to fill the trench; and etching back the second oxide layer and removing the mask using the silicon nitride layer of the mask as the stop layer, wherein the liner oxide layer and the oxide spacer are used to prevent the second oxide layer from forming recesses because of over-etching.

15. A method for forming a shallow trench isolation structure, comprising the steps of:

forming a mask over a substrate, wherein the mask has an opening;

forming a first oxide layer on the surface of the mask;

etching back the first oxide layer to form an oxide spacer on a sidewall of the mask over the surface of the substrate, wherein the oxide spacer remains during and after removal of the mask;

forming a trench in the substrate along the side edges of the oxide spacers; forming a liner oxide layer on the sidewall of the trench, wherein the liner oxide layer does not fill the trench;

depositing a second oxide layer to fill the trench; and etching back the second oxide layer and removing the mask using a wet etching method, wherein the liner oxide layer and the oxide spacer are used to prevent the second oxide layer from forming recesses because of over-etching.

16. The method of claim 3, wherein the step of removing the mask further includes the substeps of:

removing the silicon nitride layer; and removing the pad oxide layer.

* * * * *